United States Patent [19]
Ting

[11] Patent Number: 5,334,882
[45] Date of Patent: Aug. 2, 1994

[54] DRIVER FOR BACKPLANE TRANSCEIVER LOGIC BUS

[75] Inventor: Sai L. Ting, Santa Clara, Calif.

[73] Assignee: National Semiconductor, Santa Clara, Calif.

[21] Appl. No.: 990,735

[22] Filed: Dec. 14, 1992

[51] Int. Cl.$^5$ .................... H03K 3/01; H03K 17/56
[52] U.S. Cl. .................... 307/270; 307/246; 307/263; 328/185
[58] Field of Search ........... 307/263, 246, 270, 359, 307/360, 443, 228; 328/181, 184, 185

[56] References Cited

U.S. PATENT DOCUMENTS

| | | | |
|---|---|---|---|
| 4,638,186 | 1/1987 | McLaughlin | 307/270 |
| 4,866,301 | 9/1989 | Smith | 307/246 |
| 5,151,620 | 9/1992 | Lin | 307/246 |
| 5,164,611 | 11/1992 | Summe | 307/263 |

Primary Examiner—Timothy P. Callahan
Assistant Examiner—Toan Tran
Attorney, Agent, or Firm—Skjerven, Morrill, MacPherson, Franklin & Friel

[57] ABSTRACT

A driver which is particularly suitable for use with a backplane transceiver logic bus in a computer system is disclosed. In a preferred embodiment, a MOSFET is connected such that its gate and source are in a feedback loop which includes an amplifier and a first switching MOSFET. The source and drain of the MOSFET are connected in a connection path from the bus to ground, and a second switching MOSFET is connected between the gate of the MOSFET and ground. The first and second switching MOSFETS are arranged such that they switch in opposition to each other (one being turned on when the other is turned off) and a CMOS input signal is connected to the gates of the switching MOSFETS. In one state of the driver the MOSFET is turned off, in the other state the feedback loop is closed and the MOSFET is conductive. The rise and fall times of the driver's output can be controlled independently of each other.

8 Claims, 2 Drawing Sheets

DRIVER FOR BACKPLANE TRANSCEIVER LOGIC BUS

FIELD OF THE INVENTION

This invention relates to a driver which is used to deliver data to a bus in a computer system, and in particular, to a driver for a backplane transceiver logic bus.

BACKGROUND OF THE INVENTION

In computer systems, buses are used to transmit data between individual modules (containing a microprocessor, a memory, etc.). The data are transmitted over the bus in the form of a high voltage signal ($V_{OH}$), which represents a binary 1, and a low voltage signal ($V_{OL}$), which represents a binary 0. Various logic systems have adopted different values for $V_{OH}$ and $V_{OL}$. For example, in the CMOS system $V_{OH}=5V$ and $V_{OL}=0V$; and in the transistor transistor logic (TTL) system, $V_{OH}=2V$ and $V_{OL}=0.8V$. In the latest system proposed, designated as backplane transceiver logic (BTL), $V_{OH}=2.1V$ and $V_{OL}=1.1V$. Thus, over time, the voltage difference between $V_{OH}$ and $V_{OL}$ has narrowed from 5V in CMOS to 1V in BTL. Bringing $V_{OH}$ and $V_{OL}$ closer together allows for a more rapid transfer of data and a reduced noise level.

Since a system is generally based on TTL or CMOS logic, a "transceiver" is necessary to transmit the data to and receive the data from a BTL bus. Each module is associated with a transceiver. The transceiver includes two parts: a driver for delivering data from a module to the bus and a receiver for receiving data from the bus and delivering it to the module. A general block diagram of a BTL bus is illustrated in FIG. 1, which shows modules $M_1-M_n$ linked via transceivers $T_1-T_n$ to a BTL bus 10.

A conventional BTL driver 20 is illustrated in FIG. 2. Driver 20 includes a bipolar transistor 21 and a Schottky diode 22. A control circuit 23 receives an input from a module and controls the base of bipolar transistor 21. Turning transistor 21 on pulls bus 10 low and represents a binary zero; turning transistor 21 off leaves bus 10 at 2.1V and represents a binary 1.

There are several disadvantages with this arrangement. First, a significant amount of base current is required to drive transistor 21. Second, in order to turn transistor 21 off fast enough (for example, in 2 ns) current must be pulled from the base of transistor 21. This reduces the rise time of the pulses delivered by driver 20, and complicates control circuit 23. Third, it is difficult to control the rise time and the fall time of the output of driver 20. Finally, including a bipolar transistor in the driver creates a barrier to further integration since a BiCMOS process is more expensive than a CMOS process.

These problems are overcome in a BTL driver in accordance with this invention.

SUMMARY OF THE INVENTION

In the BTL driver of this invention, a transistor, preferably a MOSFET, is connected between a bus and ground. The bus is supplied by a voltage which represents a given binary number (in the preferred BTL embodiment, 2.1 V, which represents a binary 1). A control terminal (gate) of the MOSFET is connected in a negative feedback loop which includes an amplifier and a first switching means. A second switching means is connected between the control terminal of the MOSFET and a reference (ground). The components of the driver operate in the CMOS logic system. An inverter allows the driver to be used with TTL logic.

The input signal is connected to control terminals of the first and second switching means, such that when one of the switching means is open, the other is closed.

In the preferred embodiment, when a binary 1 (high voltage) appears at the input, the first switching means is turned off and the second switching means is turned on, grounding the gate of the MOSFET, and turning it off. The bus is therefore in a high state at 2.1 V. When a binary 0 appears at the input, the first switching means is turned on and the second switching means is turned off. The output of the amplifier passes to the gate of the MOSFET and it begins to turn on. This reduces the voltage of the bus and the input of the amplifier until it reaches a steady state value (in the preferred embodiment, about 0.9 V).

The rise and fall times of the output from the driver can be controlled independently. A capacitor (which can be parasitic) connected to the gate of the MOSFET, along with the impedance of the first and second switching means, determines the rate at which the voltage at the gate changes. This in turn determines the rate at which the MOSFET turns on and the fall time of the output of the driver. The impedance of the second switching means when closed determines the rate at which the MOSFET turns off and the rise time of the output of the driver.

DESCRIPTION OF THE INVENTION

Figure 1:
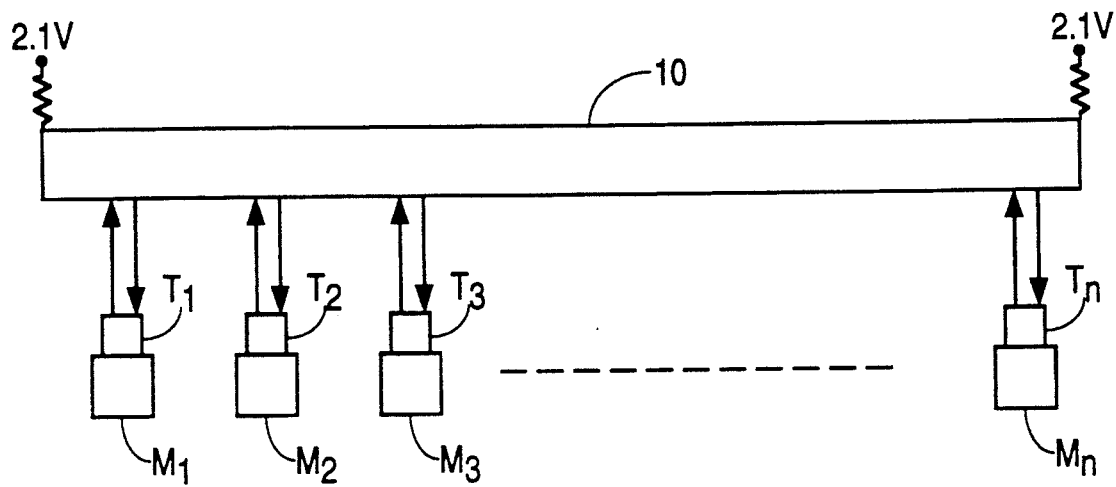
FIG. 1 illustrates a block diagram of a conventional arrangement of modules connected to a bus.
Figure 2:
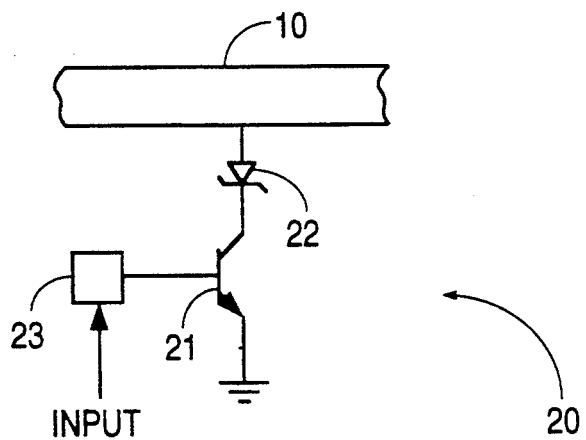
FIG. 2 illustrates a circuit diagram of a prior art BTL bus driver using a bipolar transistor.
Figure 3:
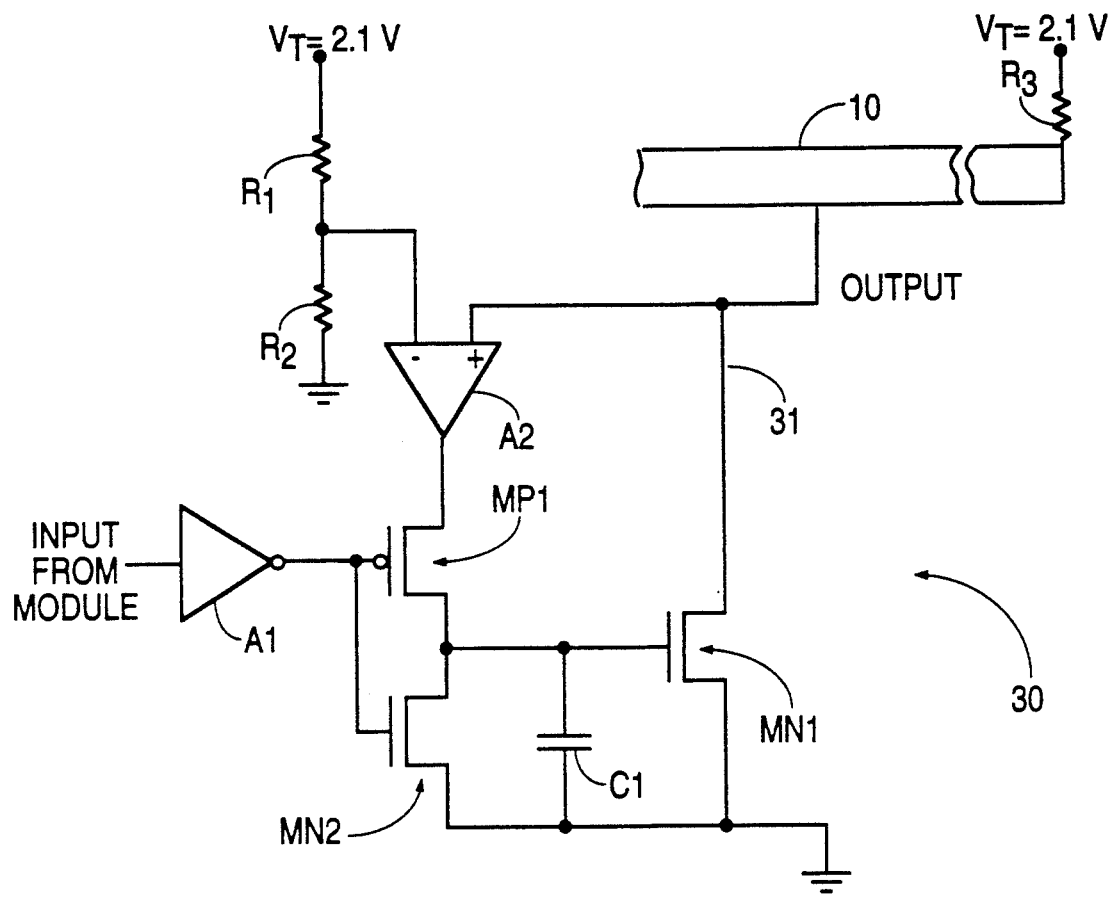
FIG. 3 illustrates a circuit diagram of a BTL bus driver in accordance with the invention.

A circuit diagram of a BTL bus driver 30 in accordance with the invention is illustrated in FIG. 3. The components of bus driver 30 are CMOS. An N-channel MOSFET MN1 is connected between bus 10 and ground. Bus 10 is connected via a termination resistor $R_3$ to a source of voltage which is at a level representing a binary 1. Since bus 10 is a BTL bus, the voltage ($V_T$) is equal to 2.1 V. The value of $R_3$ is typically 12.5 Ω. The gate and source of MOSFET MN1 are connected in a negative feedback loop 31 which includes an amplifier A2 and a P-channel MOSFET MP1. The positive terminal of amplifier A2 is connected into feedback loop 31. The negative terminal of amplifier A2 is connected to a reference voltage $V_{REF}$, which in this case is approximately equal to 0.9V. The reference voltage is provided by a voltage divider which includes resistors $R_1$ and $R_2$.

The gate of MOSFET MN1 is also connected via an N-channel MOSFET MN2 to ground. The input from a module (not shown) is passed through an inverter A1, which acts as a buffer, and is delivered to the gates of MOSFET MN2 and MOSFET MP1. A capacitor C1 is connected between the gate of MOSFET MN1 and ground, in parallel with MOSFET MN2.

The operation of BTL driver 30 can be described as follows. Assume that the module is a TTL system. If the input is low (0.8V), the output of inverter A1 is 5V. As a result, P-channel MOSFET MP1 is turned off and N-channel MOSFET MN2 is turned on, grounding the gate of MOSFET MN1 and turning it off. In this situation, bus 10 and the positive input to amplifier A2 are at 2.1V and the output of amplifier A2 is high. For example, if the gain of amplifier A2 may be 50. However, since MOSFET MP1 is turned off, this voltage does not reach the gate of MOSFET MN1.

When the input goes high (2V), the output of inverter A1 falls to 0V. This turns MOSFET MN2 off and turns MOSFET MP1 on. The output of amplifier A2 is thus connected to the gate of MOSFET MN1, and MOSFET MN1 turns on. As current flows through MOSFET MN1, the voltage on bus 10 and at the positive input to amplifier A2 falls until it reaches a level of approximately 0.9V. This is the steady-state condition of feedback loop 31, wherein the output of amplifier A2 provides a gate voltage for MOSFET MN1 which is sufficient to produce a voltage drop across resistor $R_3$ of approximately 1.2V. At the steady-state condition, the positive and negative inputs of amplifier A2 are nearly equal.

When the input again goes high, MOSFET MP1 is turned off, MOSFET MN2 is turned on, and MOSFET MN1 is turned off. The propagation delay from the input to the gate of MOSFET MN1 is an inverter delay with a typical value of less than 0.5 ns.

With a single inverter A1 the output of bus driver 30 is high when the input is low, and vice-versa (negative logic). If positive logic is desired, a second inverter may be added at the input of the driver. If the module is in CMOS, the inverter may be omitted.

The rise and fall times of the output of driver 30 are controlled by the voltage at the gate of MOSFET MN1 and can be controlled independently of each other. Since the output of driver 30 is falling when the gate voltage of MOSFET MN1 is rising, the fall time of the output is determined by the amount of current supplied by amplifier A2 and the value of capacitor C1 (taking into account the total capacitance at the gate of MOSFET MN1). Thus, by setting the current from amplifier A2 and the value of capacitor C1 appropriately, a desired fall time of the output can be achieved. When the output of driver 30 is rising, the gate of MOSFET MN1 is discharging through MOSFET MN2, and thus the rise time of the output can be adjusted by varying the on-resistance of MOSFET MN2.

The embodiments described above are intended to be illustrative and not limiting. Numerous additional embodiments will be apparent to those skilled in the art, and all such embodiments are included within the broad scope of this invention, as defined in the following claims.

I claim:

1. A driver for a bus in a multiprocessor, said driver comprising:
   a transistor connected between said bus and a first reference voltage, said transistor having a first terminal and a control terminal;
   a feedback loop connected between said first terminal and said control terminal, said feedback loop comprising a first switching means and an amplifier, said amplifier having a first input terminal connected to said first terminal and a second input terminal connected to a second reference voltage;
   a second switching means connected between said control terminal and said first reference voltage; and
   an input to said driver connected to a control terminal of said first switching means.

2. The driver of claim 1 wherein said input of said driver is also connected to a control terminal of said second switching means.

3. The driver of claim 2 wherein during operation one of said first and second switching means is turned off when the other of said first and second switching means is turned on.

4. The driver of claim 1 wherein said transistor comprises a MOSFET.

5. The driver of claim 3 wherein said first switching means comprises a P-channel MOSFET, said second switching means comprises an N-channel MOSFET, and said transistor comprises an N-channel MOSFET.

6. The driver of claim 5 wherein said first reference voltage is a circuit ground.

7. The driver of claim 6 comprising an inverter, said inverter being connected between said input of said driver and said control terminals of said first and second switching means.

8. The driver of claim 1 comprising a capacitor connected between said control terminal of said transistor and said first reference voltage.

* * * * *